(12) United States Patent
Abe et al.

(10) Patent No.: US 9,871,024 B2
(45) Date of Patent: Jan. 16, 2018

(54) LIGHT-EMITTING APPARATUS AND ILLUMINATION APPARATUS

(71) Applicant: PANASONIC INTELLECTUAL PROPERTY MANAGEMENT CO., LTD., Osaka (JP)

(72) Inventors: Masumi Abe, Osaka (JP); Naoki Tagami, Osaka (JP); Toshiaki Kurachi, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/451,985

(22) Filed: Mar. 7, 2017

(65) Prior Publication Data
US 2017/0263591 A1 Sep. 14, 2017

(30) Foreign Application Priority Data
Mar. 8, 2016 (JP) .................. 2016-045021

(51) Int. Cl.
| | |
|---|---|
| H01L 33/44 | (2010.01) |
| H01L 25/075 | (2006.01) |
| H01L 33/50 | (2010.01) |
| H01L 33/62 | (2010.01) |
| H01L 25/00 | (2006.01) |
| H01L 27/15 | (2006.01) |

(52) U.S. Cl.
CPC .......... *H01L 25/0753* (2013.01); *H01L 25/50* (2013.01); *H01L 33/504* (2013.01); *H01L 33/62* (2013.01); *H01L 27/156* (2013.01); *H01L 33/44* (2013.01); *H01L 2933/005* (2013.01); *H01L 2933/0033* (2013.01); *H01L 2933/0041* (2013.01)

(58) Field of Classification Search
CPC ...... H01L 33/44; H01L 27/156; H01L 33/504
USPC ................................ 438/28, 34; 257/89, 100
See application file for complete search history.

(56) References Cited

U.S. PATENT DOCUMENTS

| | | |
|---|---|---|
| 9,420,642 B2 | 8/2016 | Abe et al. |
| 2004/0135506 A1* | 7/2004 | Nishimura ............... H01J 9/261 313/582 |

(Continued)

FOREIGN PATENT DOCUMENTS

JP          2015-35598          2/2015

*Primary Examiner* — George Fourson, III
(74) *Attorney, Agent, or Firm* — Greenblum & Bernstein, P.L.C.

(57) ABSTRACT

A light-emitting apparatus is provided. The light-emitting apparatus includes a first and second light-emitting elements disposed on a substrate. A sealing layer is above the first and second light-emitting elements for sealing the first and second light-emitting elements. A first phosphor layer is above a first portion of the sealing layer. The first phosphor layer includes at least one first phosphor. A second phosphor layer is above a second portion of the sealing layer. The second phosphor layer includes at least one second phosphor. The first phosphor layer is configured to emit light, which is emitted as a result of emission by the first light-emitting element, having a first color. The second phosphor layer is configured to emit light, which is emitted as a result of emission by the second light-emitting element, having a second color different from the first color.

20 Claims, 7 Drawing Sheets

(56) References Cited

U.S. PATENT DOCUMENTS

| | | | | |
|---|---|---|---|---|
| 2009/0096375 | A1* | 4/2009 | Yamashita | H01J 9/02 313/582 |
| 2011/0211336 | A1* | 9/2011 | Oshio | F21K 9/00 362/97.1 |
| 2013/0020927 | A1* | 1/2013 | Okui | H01J 11/12 313/485 |
| 2014/0160728 | A1* | 6/2014 | Kim | H01L 25/0753 362/84 |
| 2014/0191655 | A1* | 7/2014 | Kasakura | H01L 25/0753 315/32 |
| 2015/0008835 | A1 | 1/2015 | Sugiura et al. | |
| 2015/0340346 | A1* | 11/2015 | Chu | H01L 25/0753 257/89 |
| 2015/0362165 | A1* | 12/2015 | Chu | H01L 25/0753 362/235 |
| 2016/0079492 | A1 | 3/2016 | Ishimori et al. | |
| 2016/0081142 | A1* | 3/2016 | Abe | H05B 33/04 313/512 |
| 2016/0133610 | A1* | 5/2016 | Reiherzer | H01L 25/0753 257/98 |
| 2016/0146440 | A1* | 5/2016 | Jeong | H05K 1/186 362/84 |
| 2016/0149094 | A1* | 5/2016 | Onuma | H01L 25/0753 257/89 |

* cited by examiner

LIGHT-EMITTING APPARATUS AND ILLUMINATION APPARATUS

CROSS REFERENCE TO RELATED APPLICATION

This application claims the benefit of priority of Japanese Patent Application Number 2016-045021 filed on Mar. 8, 2016, the entire content of which is hereby incorporated by reference.

BACKGROUND

1. Technical Field

The present disclosure relates to a light-emitting apparatus and an illumination apparatus including the light-emitting apparatus.

2. Description of the Related Art

A chip-on-board (COB) light-emitting apparatus (light-emitting module) in which light-emitting diode (LED) chips, which are mounted on a substrate, are sealed with a phosphor-containing resin (see Japanese Unexamined Patent Application Publication No. 2015-35598, for example) is conventionally known.

SUMMARY

Light-emitting apparatuses capable of tuning colors or the like by sealing of light-emitting elements using resin materials of two types having different phosphor contents are known. In some cases, a different resin material (dam material) is disposed between (in the boundary of) the resin materials of two types in such light-emitting apparatus.

For example, in the case where components such as light-emitting elements, wires for feeding power to the light-emitting elements, and a wiring pattern on a substrate are disposed across two or more types of resin materials, the components may be, in some cases, damaged or deformed in a reliability test under sever conditions. Restricting the layout of components in order to suppress such reliability degradation decreases the flexibility in the layout of the components to be disposed on a substrate.

The present disclosure therefore provides a light-emitting apparatus and an illumination apparatus, with enhanced flexibility in the layout of components.

A light-emitting apparatus according to one aspect of the present disclosure includes: a substrate; a first light-emitting element and a second light-emitting element disposed on the substrate; a sealing layer disposed above the first light-emitting element and the second light-emitting element for sealing the first light-emitting element and the second light-emitting element; a first phosphor layer disposed above a first portion of the sealing layer, the first phosphor layer including at least one first phosphor; and a second phosphor layer disposed above a second portion of the sealing layer, the second phosphor layer including at least one second phosphor, The first phosphor layer emits light, which is emitted as a result of emission by the first light-emitting element, having a first color, and the second phosphor layer emits light, which is emitted as a result of emission by the second light-emitting element, having a second color different from the first color.

An illumination apparatus according to one aspect of the present disclosure includes: the light-emitting apparatus; and a lighting apparatus for supplying the light-emitting apparatus with power for lighting the light-emitting apparatus.

According to the present disclosure, a light-emitting apparatus and an illumination apparatus, with enhanced flexibility in the layout of components, can be achieved.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, exemplary embodiments of the present disclosure are to be described, with reference to the accompanying drawings. The exemplary embodiments described below are each general and specific illustration. Values, shapes, materials, components, and arrangement and connection between the components, steps, and the order of the steps shown in the following exemplary embodiments are merely illustrative and not intended to limit the present disclosure. Therefore, among the components in the exemplary embodiments below, components not recited in any one of the independent claims indicating the top level concept of the present disclosure are described as arbitrary components.

Figures are schematic views and do not necessarily illustrate the present disclosure precisely. In the figures, the same reference signs are used to refer to substantially the same configuration, and thus duplicate description may be omitted or simplified.

Moreover, in some drawings used for describing the embodiments below, coordinate axes are shown. Z-axis direction of the coordinate axes is, for instance, a vertical direction, plus side of the Z-axis presents upper side (above), and minus side of the Z-axis presents lower side (below). In other words, the Z-axis direction is a direction vertical to a substrate included in the light-emitting apparatus. X-axis direction and Y-axis direction are the directions that are mutually perpendicular on a plane (horizontal plane) that is vertical in the Z-axis direction. XY-plane is a plane that is parallel to a main surface of the substrate included in the light-emitting apparatus. In the embodiments below, "plan view shape", for example, refers to a shape when viewed from the Z-axis direction.

Embodiment 1

Configuration of Light-Emitting Apparatus

Figure 1:
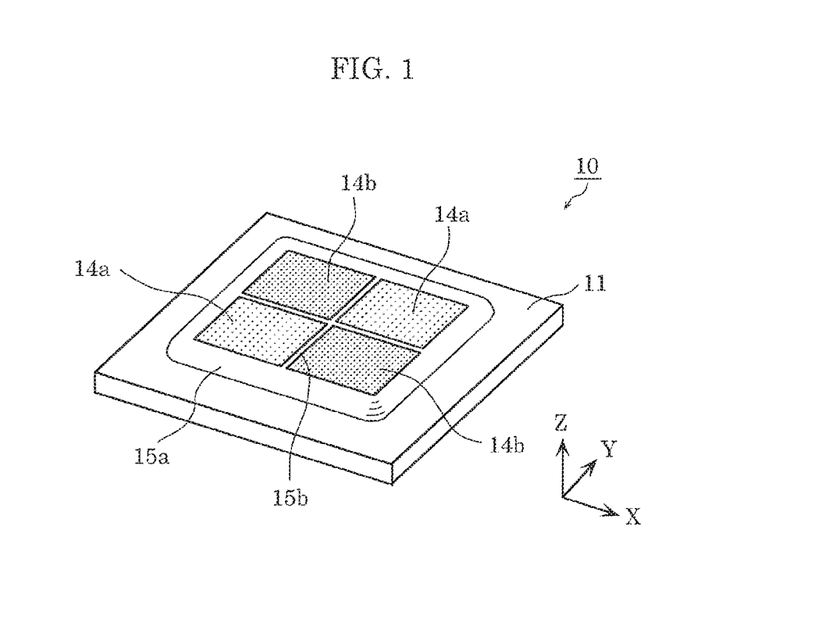
FIG. 1 is an external perspective view of a light-emitting apparatus according to Embodiment 1.
Figure 2:
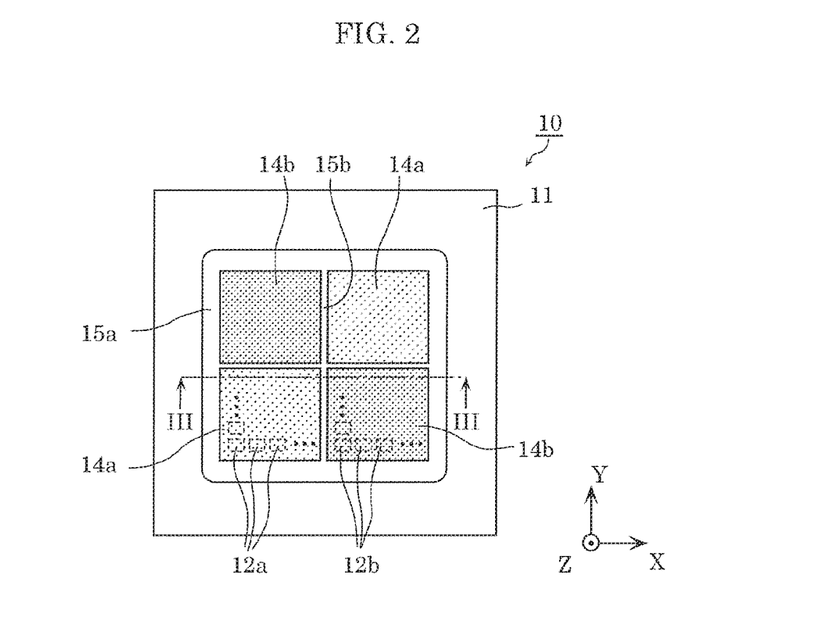
FIG. 2 is a plan view of the light-emitting apparatus according to Embodiment 1.
Figure 3:
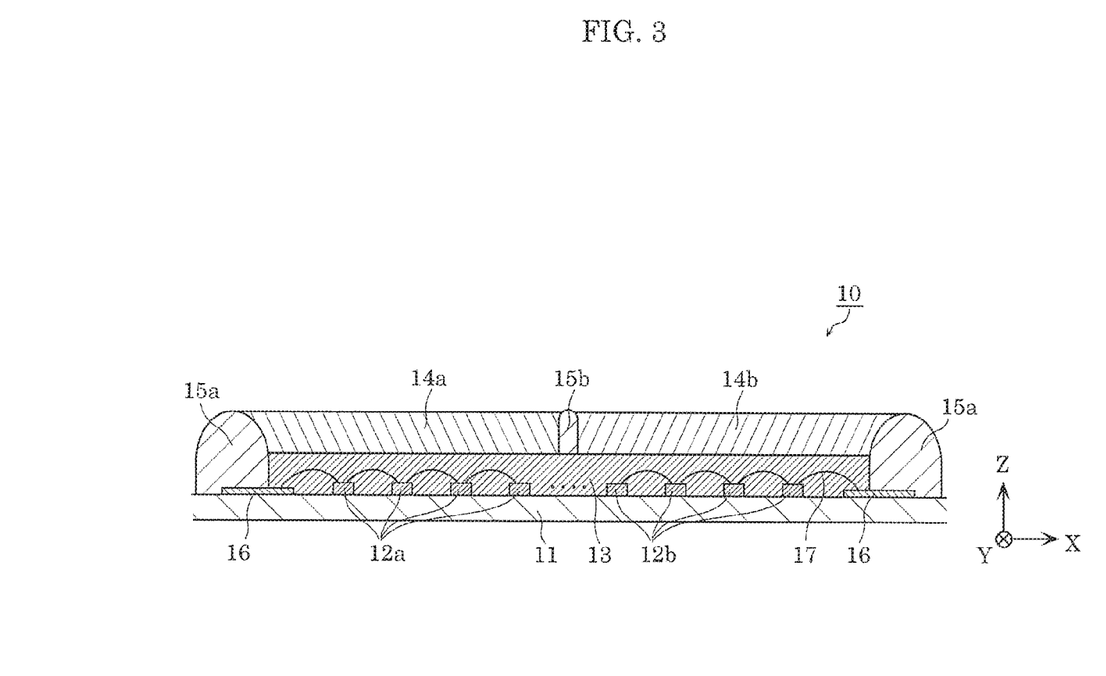
FIG. 3 is a schematic cross-sectional view of the light-emitting apparatus, taken along the line III-III in FIG. 2.

First, a configuration of a light-emitting apparatus according to Embodiment 1 is described with reference to the accompanying drawings. FIG. 1 is an external perspective view of the light-emitting apparatus according to Embodiment 1. FIG. 2 is a plan view of the light-emitting apparatus according to Embodiment 1. FIG. 3 is a schematic cross-sectional view of the light-emitting apparatus, taken along the line III-III in FIG. 2. It should be noted that a wiring pattern on substrate 11 and bonding wires used for electrically connecting LED chips is not shown in FIGS. 1 and 2.

As shown in FIGS. 1 through 3, light-emitting apparatus 10 according to Embodiment 1 includes substrate 11, first LED chips 12a, second LED chips 12b, sealing layer 13, first phosphor layer 14a, second phosphor layer 14b, and dam materials 15a and 15b. It should be noted that light-emitting apparatus 10 may include at least one first LED chip 12a and one second LED chip 12b.

Light-emitting apparatus 10 is what is known as a chip-on-board (COB) LED module in which first LED chips 12a and second LED chips 12b are directly mounted on substrate 11.

Substrate 11 is a substrate that has an interconnect region in which wiring 16 (shown in FIG. 3) is included. Wiring 16 is a metal line for supplying first LED chips 12a and second LED chips 12b with power. It should be noted that an electrode for electrically connecting light-emitting apparatus 10 and an external apparatus is set as a part of wiring 16 on substrate 11, although not shown in the diagram. Substrate 11 is, for example, a metal base substrate or a ceramic substrate. Alternatively, substrate 11 may be a resin substrate for which a resin is used as a base material.

In the case of using a ceramic substrate as substrate 11, an alumina substrate comprising aluminum oxide (alumina), or an aluminum nitride substrate comprising aluminum nitride, or the like, is adopted. In the case of using a metal base substrate as substrate 11, an aluminum alloy substrate, an iron alloy substrate, a copper alloy substrate, or the like, which has an insulating film formed on its surface, is adopted, for example. In the case of using a resin substrate as substrate 11, a glass-epoxy substrate comprising fiberglass and an epoxy resin, or the like, is adopted, for instance.

It should be noted that substrate 11 may be a substrate having high optical reflectance (e.g., optical reflectance of 90% or higher). By using such substrate with high optical reflectance as substrate 11, the light emitted by LED chips 12 is allowed to reflect off the surface of substrate 11. As a result, the light extraction efficiency of light-emitting apparatus 10 is enhanced. Examples of such a substrate include a white ceramic substrate for which alumina is used as a base material.

Alternatively, substrate 11 may be a translucent substrate having high light-transmittance. Examples of such a substrate include a translucent ceramic substrate comprising polycrystalline alumina or aluminum nitride, a transparent glass substrate comprising glass, a quartz substrate comprising quartz, a sapphire substrate comprising sapphire, and a transparent resin substrate comprising a transparent resin material.

It should be noted that in Embodiment 1, substrate 11 is formed in a rectangular shape, but it may be formed in any other shape such as a circular shape or the like.

First LED chip 12a is merely an example of a first light-emitting element, and is disposed (mounted) on substrate 11. LED chip 12a is, for example, a gallium-nitride-based blue LED chip comprising InGaN-based material, having a center wavelength (a peak wavelength of emission spectrum) of 430 nm or greater and 480 nm or less. In other words, first LED chip 12a emits blue light. First LED chip 12a emits mostly upward, that is, mostly towards first phosphor layer 14a.

Although not shown in detail in FIGS. 1 through 3, all of first LED chips 12a mounted on substrate 11 are electrically connected so that the light can be turned on and off all together. Here, first LED chips 12a are connected chip-to-chip via bonding wire 17. Bonding wire 17 is a wire for power feeding and is connected to first LED chips 12a. It should be noted that gold (Au), silver (Ag), copper (Cu), and the like are used, for instance, as the metallic materials of bonding wire 17 and wiring 16 described above.

Second LED chip 12b is merely an example of a second light-emitting element, and is disposed (mounted) on substrate 11. Second LED chip 12b is, for example, a gallium-nitride-based blue LED chip comprising InGaN-based material, having a center wavelength (a peak wavelength of emission spectrum) of 430 nm or greater and 480 nm or less. In other words, second LED chip 12b emits blue light. Such second LED chip 12b emits mostly upward, that is, towards second phosphor layer 14b).

Thus, the LED chips of the same type are used for first LED chips 12a and second LED chips 12b, but the type of first LED chip 12a may be different from the type of second LED chip 12b.

Although not shown in detail in FIGS. 1 through 3, all of second LED chips 12b mounted on substrate 11 are electrically connected so that the light can be turned on and off all together. Here, second LED chips 12b are connected chip-to-chip via bonding wire 17. Bonding wire 17 is thus a wire for power feeding and is connected to first LED chips 12a or second LED chips 12b.

In the case where a top surface of substrate 11 is divided into four rectangular regions, first LED chips 12a are mounted, for instance, in a matrix state in each of the two regions that are diagonally positioned. In each of the two remaining rectangular regions, second LED chips 12b are mounted, for instance, in a matrix state. Such four rectangular regions are the regions corresponding to the dispositions of first phosphor layer 14a and second phosphor layer 14b shown in FIG. 2.

Although not shown in FIGS. 1 through 3, an electrode for supplying first LED chips 12a with power from an external apparatus and an electrode for supplying second LED chips 12b with power from an external apparatus are separately disposed on substrate 11. In other words, emissions of first LED chips 12a and second LED chips 12b can be controlled separately. With such configuration, it is possible to tune the white light emitted by light-emitting apparatus 10.

It should be noted that, in some cases, even when a shared electrode is provided for the electrode for supplying first LED chips 12a with power from an external apparatus and the electrode for supplying second LED chips 12b with power, it is possible to tune the white light emitted by light-emitting apparatus 10. For example, in the circuit configuration where first LED chips 12a and second LED chips 12b are connected in parallel, it is possible to tune the white light emitted by light-emitting apparatus 10 by using constant-voltage elements such as zener diodes or the like. Such technology is described in Japanese Unexamined Patent Application Publication No. 2015-35598. Thus, it is not indispensable that the emissions of first LED chips 12a and second LED chips 12b be separately controlled, and they may be controlled in association with each other.

Dam material 15a is an example of a first dam material and is disposed on substrate 11. Dam material 15a is a material for holding back sealing layer 13, first phosphor layer 14a, and second phosphor layer 14b. For dam material 15a, a thermoset, resin, a thermoplastic resin, or the like, which has insulation properties is used, for example. More specifically, a silicone resin, a phenolic resin, an epoxy resin, a bismaleimid triazine (BT) resin, polyphthalamide (PPA) resin, or the like is used for dam material 15a.

It is desirable that dam material 15a have optical reflectivity to enhance the light extraction efficiency of light-emitting apparatus 10. Accordingly, a white-colored resin (what is known as a white resin) is used for dam material 15a in Embodiment 1. It should be noted that dam material 15a may include particles of $TiO_2$, $Al_2O_3$, $ZrO_2$, MgO, etc. to enhance the optical reflectivity of dam material 15a.

In light-emitting apparatus 10, dam material 15a is formed on substrate 11 so as to enclose first LED chips 12a and second LED chips 12b. A plan view shape of dam material 15a is a ring shape. Sealing layer 13, first phosphor layer 14a, and second phosphor layer 14b are then disposed in a region enclosed by dam material 15a. This can enhance the light extraction efficiency of light-emitting apparatus 10. It should be noted that the shape of dam material 15a is not particularly limited to a ring shape. For example, an outer shape of dam material 15a may be formed in a toric shape.

Sealing layer 13 seals, all together, a portion of wiring 16 at least, first LED chips 12a, second LED chips 12b, and bonding wires 17. Sealing layer 13 has a function to protect first LED chips 12a, second LED chips 12b, and bonding wires 17 from refuse, moisture, external force, etc. In addition, sealing layer 13 has a function to reduce the effects of heat resulting from the emission by first LED chips 12a or second LED chips 12b. Sealing layer 13 comprises a translucent resin material. A methyl-based silicone resin is used, for example, for the translucent resin material, but an epoxy resin, a urea resin, or the like may be used.

In Embodiment 1, sealing layer 13 does not include a phosphor, but a phosphor may be included therein. In the case where a phosphor is included in sealing layer 13, the light emitted by first LED chips 12a and the light emitted by second LED chips 12b are diffused by the phosphor included in sealing layer 13 and reach first phosphor layer 14a and second phosphor layer 14b. It is therefore possible to enhance the homogeneity of the light emitted by light-emitting apparatus 10. Sealing layer 13 may include, for instance, at least one of yellow phosphor and red phosphor. In the case where sealing layer 13 includes both of the yellow phosphor and the red phosphor, a color temperature of the white light emitted from sealing layer 13 is 5000 K, for instance, resulting from the adjustment of contents (contained amounts) of the yellow phosphor and the red phosphor in sealing layer 13. It should be noted that sealing layer 13 may include filler because filler, which will be mentioned later on, has the same effects of diffusing light as realized by a phosphor.

First phosphor layer 14a is disposed above the portion of sealing layer 13, which seals first LED chips 12a, and comprises a translucent resin material that includes a phosphor. The portion of sealing layer 13 which seals first LED chips 12a is an example of a first portion. First phosphor layer 14a is in contact with the portion of sealing layer 13, which seals first LED chip 12a. The base material of first phosphor layer 14a is, for instance, a methyl-based silicone resin, but an epoxy resin, a urea resin, or the like may be used. It is preferable that the base material of first phosphor layer 14a is the same as the translucent resin material which forms sealing layer 13.

First phosphor layer 14a includes, for instance, a yellow phosphor and a red phosphor. More specifically, the yellow phosphor is a yttrium aluminum garnet (YAG)-based phosphor having a peak wavelength of emission spectrum of 550 nm or greater and 570 nm or less, for example, and the red phosphor is a $CaAlSiN_3$:$Eu^{2+}$-based phosphor or a (Sr, Ca)$AlSiN_3$:$Eu^{2+}$-based phosphor having a peak wavelength of emission spectrum of 610 nm or greater and 620 nm or less, for example.

The phosphor included in first phosphor layer 14a shall not be particularly limited to those described above. First phosphor layer 14a may include a phosphor that is excited by the light emitted by first LED chips 12a. Moreover, first phosphor layer 14a may include filler. The filler is, for instance, silica having a particle diameter of about 10 nm. The inclusion of filler makes it difficult for the phosphor to settle due to the filler serving as a resistance. This therefore allows the phosphor to be homogenously diffused and disposed in first phosphor layer 14a.

When first LED chip 12a emits blue light, a part of the emitted blue light is wavelength-converted into yellow light by the yellow phosphor included in first phosphor layer 14a. In addition, a part of the emitted blue light is wavelength-converted into red light by the red phosphor included in first phosphor layer 14a. Then, the blue light that has not been absorbed by the yellow phosphor and the red phosphor, the yellow light that has been wavelength-converted by the yellow phosphor, and the red light that has been wavelength-converted by the red phosphor are diffused and mixed in first phosphor layer 14a. Accordingly, white light is emitted from first phosphor layer 14a. The color temperature of this white light is, for instance, 2700 K, obtained as a result of adjusting the contents of the yellow phosphor and the red phosphor in first phosphor layer 14a.

Second phosphor layer 14b is disposed above the portion of sealing layer 13, which seals second LED chips 12b, and comprises a translucent resin material that includes a phosphor. The portion of sealing layer 13 which seals second LED chips 12b is an example of a second portion. Second phosphor layer 14b is in contact with the portion of sealing layer 13, which seals second LED chip 12b. Moreover, second phosphor layer 14b and first phosphor layer 14a as described above are disposed on a top surface of sealing layer 13 in parallel in a direction along the top surface. The base material of second phosphor layer 14b is, for example, a methyl-based silicone resin, but an epoxy resin, a urea resin, or the like may be used. It is preferable that the base material of second phosphor layer 14b is the same as the translucent resin material which forms sealing layer 13.

Second phosphor layer 14b includes, for instance, a yellow phosphor and a red phosphor. More specifically, the yellow phosphor is a YAG-based phosphor and the red phosphor is a $CaAlSiN_3$: $Eu^{2+}$-based phosphor or a (Sr, Ca)$AlSiN_3$:$Eu^{2+}$-based phosphor.

The phosphor included in second phosphor layer 14b shall not be particularly limited to those described above. Second phosphor layer 14b may include a phosphor that is excited by the light emitted by second LED chip 12b. Second phosphor layer 14b may include filler. The filler is, for instance, silica having a particle diameter of about 10 nm. The inclusion of filler makes it difficult for the phosphor to settle due to the filler serving as a resistance. This therefore allows the phosphor to be homogenously diffused and disposed in second phosphor layer 14b.

When second LED chip 12b emits blue light, a part of the emitted blue light is wavelength-converted into yellow light by the yellow phosphor included in second phosphor layer 14b. In addition, a part of the emitted blue light is wavelength-converted into red light by the red phosphor included in second phosphor layer 14b. Then, the blue light that has not been absorbed by the yellow phosphor and the red phosphor, the yellow light that has been wavelength-converted by the yellow phosphor, and the red light that has been wavelength-converted by the red phosphor are diffused and mixed in second phosphor layer 14b. Accordingly, white light is emitted from second phosphor layer 14b. The color temperature of this white light is, for instance, 8000 K, obtained as a result of adjusting the contents of the yellow phosphor and the red phosphor in second phosphor layer 14b.

Thus, in Embodiment 1, the phosphor content in first phosphor layer 14a differs from that in second phosphor layer 14b. To be more specific, the content of the red phosphor in first phosphor layer 14a is greater than that in second phosphor layer 14b. As a result, a color (first color) of the light emitted from first phosphor layer 14a resulting from the emission by first LED chips 12a is different from a color (second color) of the light emitted from second phosphor layer 14b resulting from the emission by second LED chips 12b.

It should be noted that "a color of light is different" here means that a color of light significantly differs and does not mean that a color of light slightly differs due to production tolerance. "The color of light significantly differs" means, for instance, that a color temperature of the emission color differs by 1000 K or greater.

As has been described above, the emissions of first LED chips 12a and second LED chips 12b can be controlled separately. When only first LED chips 12a emit light, light-emitting apparatus 10 emits white light with the color temperature of 2700 K, and when only second LED chips 12b emit light, light-emitting apparatus 10 emits white light with the color temperature of 8000 K. When first LED chips 12a and second LED chips 12b both emit light, light-emitting apparatus 10 can emit white light with the color temperature of 2700 K or greater and 8000 K or less according to the emission luminance of first LED chips 12a and second LED chips 12b. Thus, light-emitting apparatus 10 is a light-emitting apparatus adapted to the color-tuning control.

It should be noted that first phosphor layer 14a and second phosphor layer 14b may be in contact with each other, however, dam material 15b is disposed between (in the boundary of) first phosphor layer 14a and second phosphor layer 14b in Embodiment 1.

Dam material 15b is an example of a second dam material and is disposed above sealing layer 13. Dam material 15b is in contact with sealing layer 13. Dam material 15b is a material for determining a boundary between first phosphor layer 14a and second phosphor layer 14b. In Embodiment 1, a plan view shape of dam material 15b is a cross shape uniformly dividing the rectangular region enclosed by dam material 15a into four. First LED chips 12a are mounted onto the lower side in the two regions that are positioned diagonally among the four regions divided by dam material 15b, and first phosphor layer 14a is disposed above these two regions. Second LED chips 12b are mounted on the lower side in the remaining two regions, and second phosphor layer 14b is disposed in these two regions.

For dam material 15b, a thermoset resin, a thermoplastic resin, or the like, which has insulation properties, is used, for example. More specifically, a silicone resin, a phenolic resin, an epoxy resin, a bismaleimid triazine (BT) resin, polyphthalamide (PPA) resin, or the like is used for dam material 15b. It is preferable that dam material 15b be formed using the same material as used for dam material 15a.

It is desirable that dam material 15b have optical reflectivity to enhance the light extraction efficiency of light-emitting apparatus 10. Accordingly, a white-colored resin (what is known as a white resin) is used for dam material 15b in Embodiment 1. It should be noted that dam material 15b may include particles of $TiO_2$, $Al_2O_3$, $ZrO_2$, MgO, etc. to enhance the optical reflectivity of dam material 15b.

With such dam material 15b, it is possible to suppress the following: a part of the light emitted from one of first phosphor layer 14a and second phosphor layer 14b enters the other of first phosphor layer 14a and second phosphor layer 14b, and thus re-excites the phosphor in the other phosphor layer. With the re-excitation being suppressed, it is possible to suppress the degradation in the light extraction efficiency.

[Method for Manufacturing Light-Emitting Apparatus]

Figure 4:
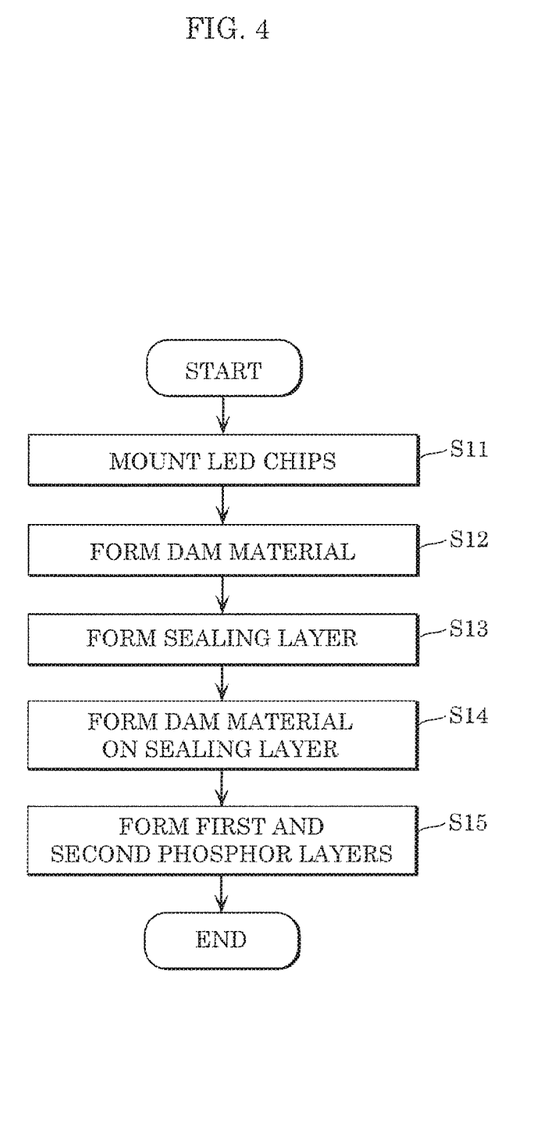
FIG. 4 is a flowchart showing a method for manufacturing the light-emitting apparatus according to Embodiment 1.
Figure 5:
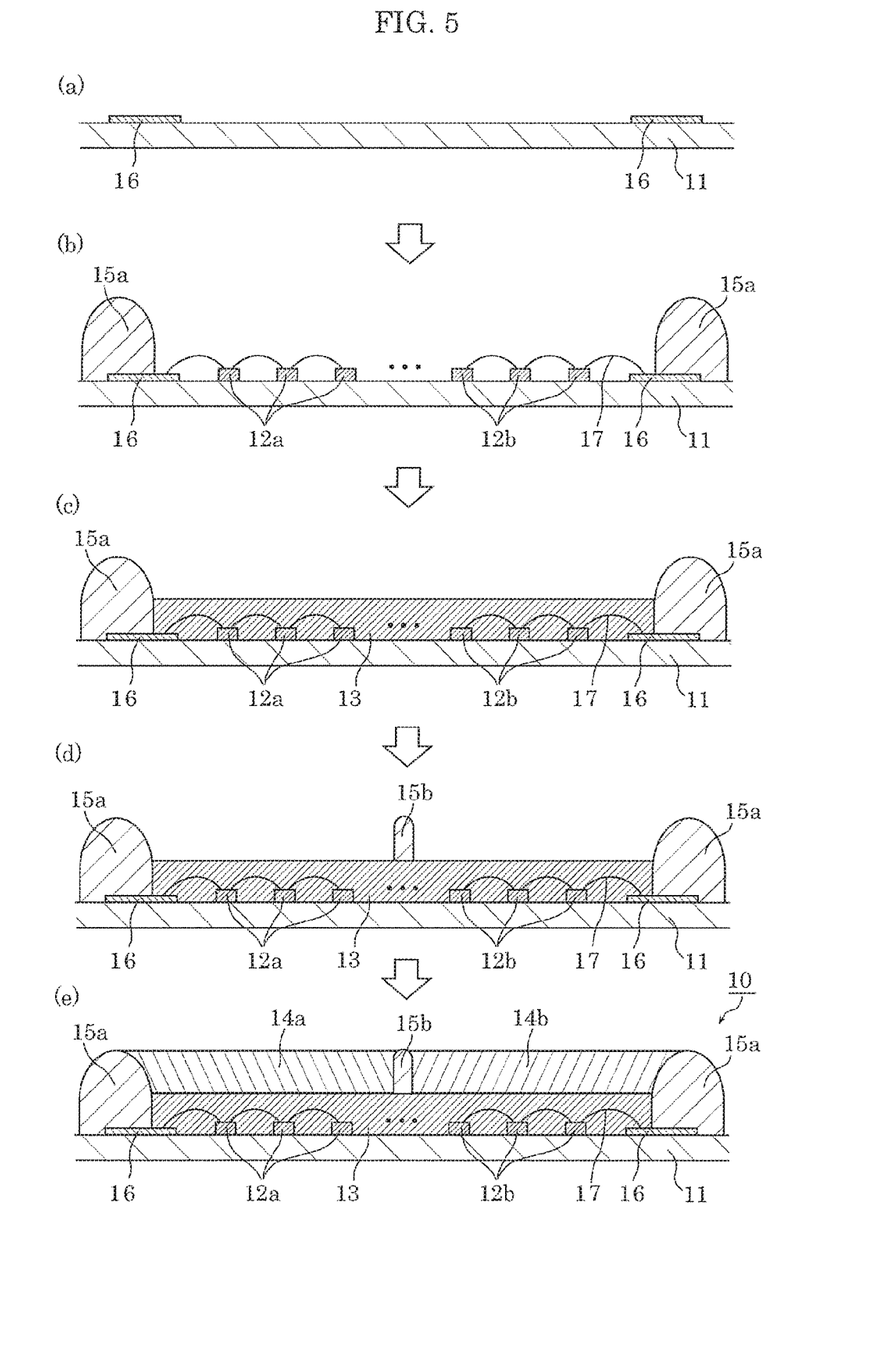
FIG. 5 shows schematic cross-sectional views illustrating the method for manufacturing the light-emitting apparatus according to Embodiment 1.

Next, a method for manufacturing light-emitting apparatus 10 will be described. FIG. 4 is a flowchart showing the method for manufacturing light-emitting apparatus 10. FIG. 5 shows schematic cross-sectional views illustrating the method for manufacturing light-emitting apparatus 10. FIG. 5 shows cross-sections corresponding to the cross-section taken along the line III-III in FIG. 2. It should be noted that the manufacturing method, the sizes, and the like used in the description below are mere examples.

First, LED chips (first LED chips 12a and second LED chips 12b) are mounted on a top surface of substrate 11 (S11), as shown in (a) and (b) of FIG. 5. In the case where the top surface of substrate 11 is divided into four rectangular regions corresponding to the four regions divided by dam material 15b, first LED chips 12a are mounted for each of the two regions that are diagonally positioned. For each of the remaining two regions, second LED chips 12b are mounted.

The LED chips are mounted by die bonding the LED chips using a die attach adhesive or the like. Here, first LED chips 12a am electrically connected via bonding wires 17 and wiring 16. Likewise, second LED chips 12b are electrically connected via bonding wires 17 and wiring 16. It should be noted that the height of the LED chip is about 0.2 mm and bonding wire 17 projects upward about 0.15 mm from the top surface of the LED chip.

Next, dam material 15a is formed in a rectangular ring shape enclosing the LED chips on the top surface of substrate 11 (S12). A dispenser that ejects a white resin is used for the formation of dam material 15a. The height of dam material 15a is about 0.8 mm to 0.9 mm.

Then, sealing layer 13 that seals LED chips all together is formed (S13) as shown in (c) of FIG. 5. More specifically, a translucent resin material (sealing material) is applied (injected) onto the region enclosed by dam material 15a, and the region is cured by heating or light illumination. The thickness of sealing layer 13 is 0.4 mm or so.

Next, dam material 15b is formed in a cross shape on sealing layer 13 (S14), as shown in (d) of FIG. 5. A dispenser that ejects a white resin is used for the formation of dam material 15b. The height of dam material 15b is about 0.4 mm to 0.5 mm.

Then, first phosphor layer 14a and second phosphor layer 14b are formed as shown in (e) of FIG. 5. To be more specific, a translucent resin material including a phosphor, for forming first phosphor layer 14a, is applied (injected) onto the part of sealing layer 13, which seals first LED chips 12a. On the part of sealing layer 13, which seals second LED chips 12b, a translucent resin material including a phosphor, for forming second phosphor layer 14b, is applied (injected). After that, by curing the applied translucent resin material by heating or light illumination, first phosphor layer 14a and second phosphor layer 14b are formed. The thickness of first phosphor layer 14a or second phosphor layer 14b is 0.4 mm or so.

[Effects]

Generally, in a light-emitting apparatus adaptable for color-tuning function, LED chips are sealed using two types of resin materials which have different phosphor contents. In some cases, a different resin material (dam material) is disposed between two types of resin materials including a phosphor, in such light-emitting apparatus.

For example, in the case where wires for feeding power to the LED chips or a wiring pattern on the substrate is disposed across the resin materials of two or more types, the wires or the wiring pattern may be damaged or deformed during a reliability test under severe conditions such as heat cycle and the like. Restricting the layout of a wire and a wiring pattern in order to suppress such reliability degradation decreases the flexibility in the dispositions (layout) of the components to be disposed on a substrate.

As a solution to this, light-emitting apparatus 10 includes: substrate 11; first LED chips 12a and second LED chips 12b disposed on the substrate; sealing layer 13 disposed above first LED chips 12a and second LED chips 12b for sealing the first LED chips 12a and the second LED chips 12b; first phosphor layer 14a disposed above a first portion of sealing layer 13, including at least one first phosphor; and second phosphor layer 14b disposed above a second portion of sealing layer 13, including at least one second phosphor. First LED chip 12a is an example of the first light-emitting element and second LED chip 121) is an example of the second light-emitting element.

First phosphor layer 14a emits light, which is emitted as a result of the emission by first LED chips 12a, having a first color, and the second phosphor layer 14b emits light, which is emitted as a result of the emission by the light emission by second LED chips 12b, having a second color different from the first color.

With such feature, first LED chips 12a and second LED chips 12b are sealed with sealing layer 13 of one type, there is no need to decide the layout of the components on substrate 11 in view of a position of a boundary between the sealing layers as in the case of sealing with the use of two types of sealing materials (sealing layers). Therefore, with light-emitting apparatus 10, the degradation of reliability is suppressed, and also, the flexibility in the layout of the components to be disposed on substrate 11 is enhanced. To be more precise, the flexibility in the layout of first LED chips 12a and second LED chips 12b is enhanced. This also improves the flexibility in the disposition of first phosphor layer 14a that is required to be disposed above first LED chips 12a as well as the disposition of second phosphor layer 14b that is required to be disposed above second LED chips 12b.

In addition, light-emitting apparatus 10 may further include dam material 15a that is disposed on substrate 11 so as to enclose first LED chips 12a and second LED chips 12b. Sealing layer 13, first phosphor layer 14a, and second phosphor layer 14b may be disposed in a region enclosed by dam material 15a. Dam material 15a is an example of the first dam material (dam).

With such configuration, the flexibility in the layout of the components to be disposed on substrate 11 is enhanced in light-emitting apparatus 10 having a dam structure.

Moreover, light-emitting apparatus 10 may further include dam material 15b that is disposed above sealing layer 13 and between first phosphor layer 14a and second phosphor layer 14b. Dam material 15b is an example of the second dam material (dam).

With such dam material 15b, it is possible to suppress the following: a part of the light emitted from one of first phosphor layer 14a and second phosphor layer 14b enters the other of first phosphor layer 14a and second phosphor layer 14b, and thus re-excites the phosphor in the other phosphor layer. With the re-excitation being suppressed, it is possible to suppress the degradation in the light extraction efficiency.

A content of at least one first phosphor may be different from a content of at least one second phosphor.

With such feature, by causing the content of first phosphor to be different from the content of second phosphor, a color of the light emitted from first phosphor layer 14a is made different from a color of the light emitted from second phosphor layer 14b.

Moreover, each of at least one first phosphor and at least one second phosphor may include a yellow phosphor and a red phosphor.

With such feature, white light can be emitted and light-emitting apparatus 10 capable of color-tuning is achieved.

Furthermore, light-emitting apparatus 10 may further include bonding wire 17 (wire) connected to one of first LED chip 12a and second LED chip 12b for feeding power, and sealing layer 13 may further seal bonding wire 17.

With such configuration, bonding wire 17 is sealed in sealing layer 13 of one type so that the restriction in the layout of bonding wire 17 is eased and the flexibility in the layout of the components to be disposed on substrate 11 is enhanced.

[Variation]

Figure 6:
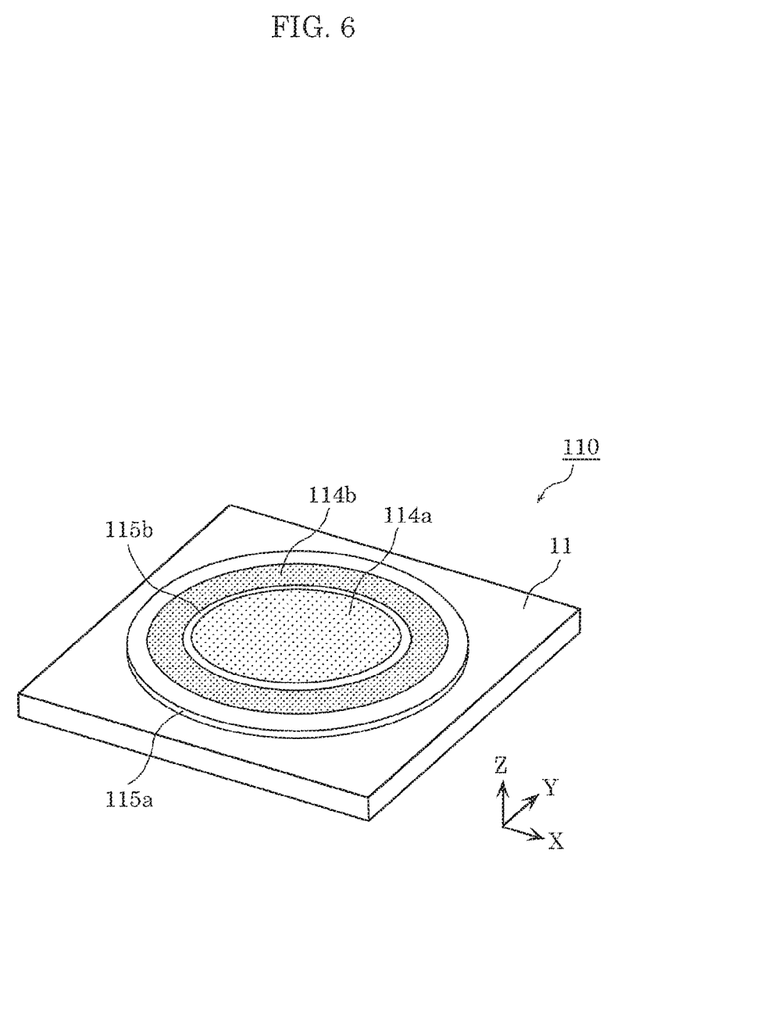
FIG. 6 is an external perspective view of a light-emitting apparatus according to a variation.

The shape of dam material 15a as described in Embodiment 1 is merely an example, and it shall not be particularly limited thereto. Moreover, the dispositions of first phosphor layer 14a and second phosphor layer 14b as has been described above in Embodiment 1 are mere examples, and they shall not be particularly limited thereto. FIG. 6 is an external perspective view of the light-emitting apparatus according to a variation.

Light-emitting apparatus 110 shown in FIG. 6 includes dam material 115a whose plan view shape is a tonic shape. In light-emitting apparatus 110, a plan view shape of first phosphor layer 114a is a circular shape and a plan view shape of second phosphor layer 114b is a tonic shape enclosing first phosphor layer 114a. Toric-shaped dam material 115b is disposed between first phosphor layer 114a and second phosphor layer 114b. It should be noted that, even in such light-emitting apparatus 110, first phosphor layer 114a, second phosphor layer 114b, and dam material 115a are disposed above a sealing layer which seals the LED chips disposed on substrate 11, although not shown in FIG. 6.

Even with such light-emitting apparatus 110, the degradation in reliability is suppressed, and also, the flexibility in the layout of the components to be disposed on substrate 11 is enhanced.

Embodiment 2

Figure 7:
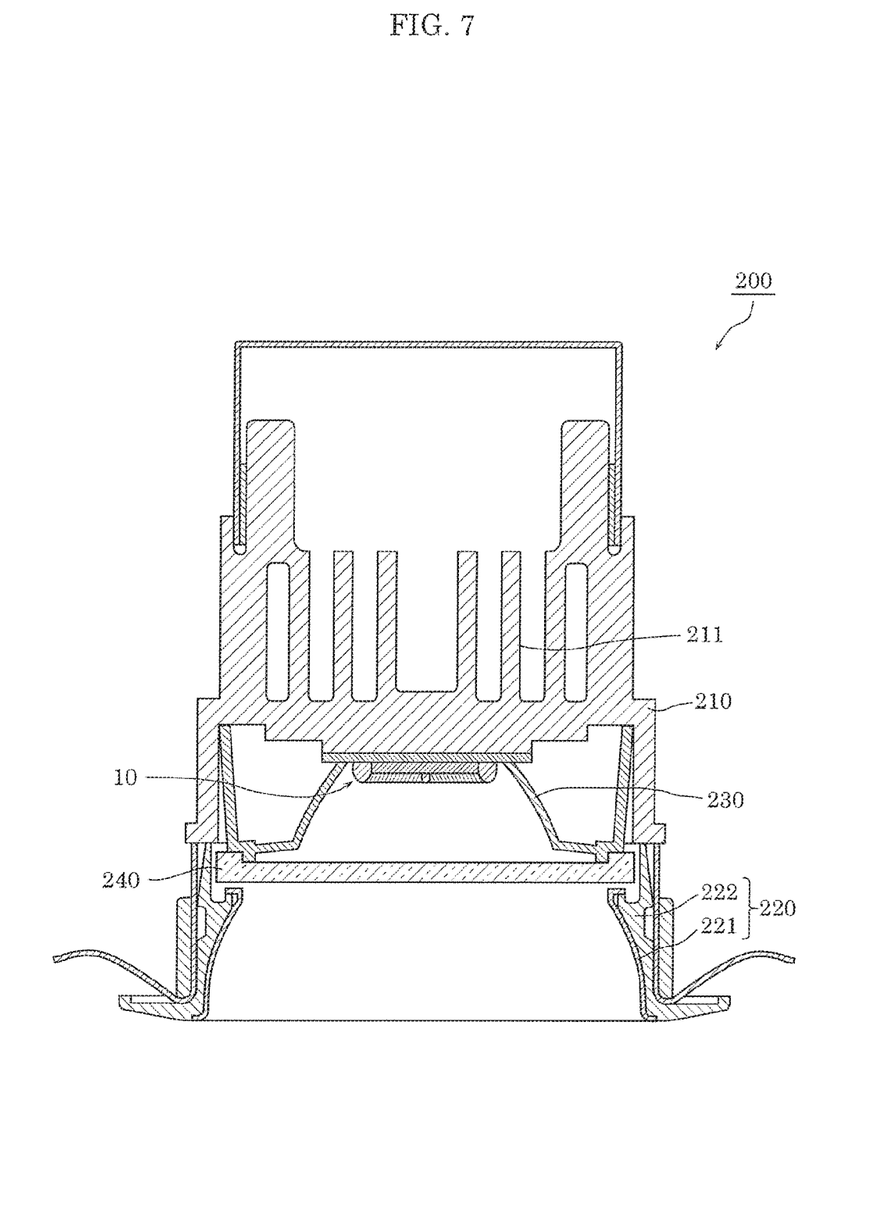
FIG. 7 is a cross-sectional view of an illumination apparatus according to Embodiment 2.
Figure 8:
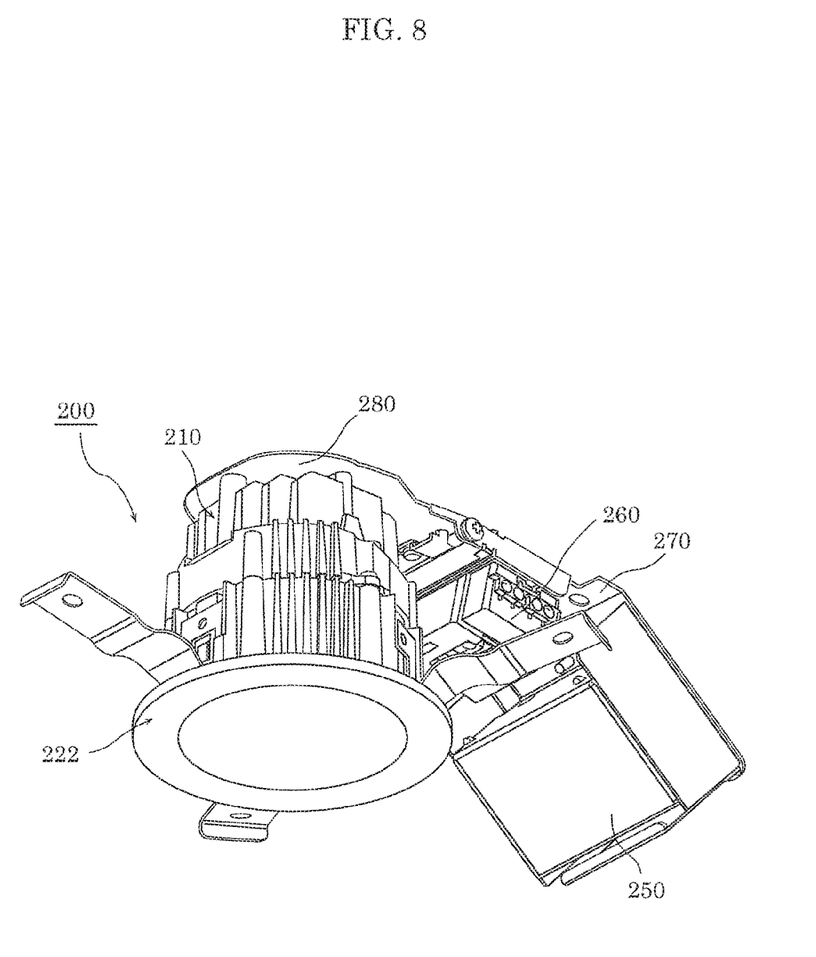
FIG. 8 is an external perspective view of the illumination apparatus according to Embodiment 2 and its peripheral components.

Next, illumination apparatus 200 according to Embodiment 2 will be described using FIGS. 7 and 8. FIG. 7 is a sectional view of illumination apparatus 200 according to Embodiment 2. FIG. 8 is an external perspective view of illumination apparatus 200 according to Embodiment 2 and its peripheral components.

As shown in FIGS. 7 and 8, illumination apparatus 200 according to Embodiment 2 is, for example, a built-in illumination apparatus, such as a downlight or the like, which is recessed into a ceiling in a house or the like, and emits light in a down direction (e.g., towards a corridor or a wall).

Illumination apparatus 200 includes light-emitting apparatus 10. Illumination apparatus 200 further includes a body having a substantially-closed-end cylindrical shape, which is configured by coupling base 210 and frame member 220, reflector 230, and translucent panel 240 which are disposed on the body. It should be noted that in the case of using light-emitting apparatus 10 for an illumination apparatus having a circular-shaped window for ejecting light, like illumination apparatus 200, dam material 15a may be preferably formed in a tonic shape.

Base 210 is a mounting base on which light-emitting apparatus 10 is mounted, and serves as a heat sink for dissipating the heat generated by light-emitting apparatus 10. Base 210 is formed in a substantially cylindrical shape using a metallic material, and is formed using aluminum in Embodiment 2.

On top of base 210 (a portion on the ceiling side), a plurality of heat dissipating fins 211 extending upward are disposed, being spaced at regular intervals along a direction. This can efficiently dissipate the heat generated by light-emitting apparatus 10.

Frame member 220 includes cone 221 having a substantially-cylindrical shape and a reflective inner surface, and frame body 222 on which cone 221 is mounted. Cone 221 is molded using a metallic material, and can be formed by drawing or press forming of aluminum alloy, for example. Frame body 222 is molded using a rigid resin material or a metallic material. Frame member 220 is fixed by mounting frame body 222 on base 210.

Reflector 230 is a ring-shaped (funnel-shaped) reflective member having internal reflectivity. Reflector 230 can be formed using a metallic material such as aluminum, for example. It should be noted that reflector 230 may also be formed using a rigid white resin material rather than a metallic material.

Translucent panel 240 is a translucent member having light diffusibility and light translucency. Translucent panel 240 is a flat plate disposed between reflector 230 and frame member 220, and mounted onto reflector 230. Translucent panel 240 can be formed in a disk shape, using a transparent resin material such as acrylic or polycarbonate.

It should be noted that illumination apparatus 200 may not include translucent panel 240. Illumination apparatus 200 without translucent panel 240 can improve luminous flux of the light emitted from illumination apparatus 200.

Moreover, as shown in FIG. 8, illumination apparatus 200 is connected to lighting apparatus 250 and terminal block 260. Lighting apparatus 250 supplies light-emitting apparatus 10 with power for lighting light-emitting apparatus 10 and terminal block 260 relays an alternating-current power from utility power supply to lighting apparatus 250. More specifically, lighting apparatus 250 converts the alternating-current relayed from terminal block 260 into a direct-current power and outputs it to light-emitting apparatus 10. Moreover, lighting apparatus 250 also includes a controller which separately controls the emissions of the light emitted from first LED chips 12a and the light emitted from second LED chips 12b. The controller is realized by a micro computer, a processor, a dedicated communication circuit, or the like.

Lighting apparatus 250 and terminal block 260 are fixed to mounting plate 270 provided separately from the body. Mounting plate 270 is formed by bending a rectangular plate member comprising a metallic material. Lighting apparatus 250 is fixed onto the undersurface of one end portion of mounting plate 270, and terminal block 260 is fixed onto the undersurface of the other end portion. Mounting plate 270 is mutually coupled to top plate 280 fixed on top of base 210 of the body.

As has already been described above, illumination apparatus 200 includes light-emitting apparatus 10, lighting apparatus 250 which supplies light-emitting apparatus 10 with power for lighting light-emitting apparatus 10. Even with such illumination apparatus 200, it is possible to suppress the degradation in the reliability of light-emitting apparatus 10, and also, to enhance the flexibility in the layout of the components to be disposed on substrate 11. It should be noted that illumination apparatus 200 may include light-emitting apparatus 110 instead of light-emitting apparatus 10.

It should be noted that a downlight is illustrated as an example of an illumination apparatus in Embodiment 2, however, the present disclosure may be implemented as any other illumination apparatus such as a spotlight or the like.

OTHER EMBODIMENTS

The light-emitting apparatus and illumination apparatus according to the exemplary embodiments of the present disclosure have been described above. However, the present disclosure is not limited to the above exemplary embodiments.

In the above exemplary embodiments, the light-emitting apparatus provides white light by a combination of LED chips which emit blue light, and yellow and red phosphors. However, the configuration for providing white light is not limited thereto.

For example, a phosphor layer that includes a red phosphor and a green phosphor may be combined with LED chips that emit blue light. In other words, each of the first phosphor layer and the second phosphor layer may include a red phosphor and a green phosphor. Alternatively, ultra-violet LED chips which emit ultra violet light having shorter wavelengths than LED chips that emit blue light may be combined with a blue phosphor, a green phosphor, and a red phosphor, which respectively emit a blue light, a green light, and a red light as a result of being excited mainly by ultra violet light. Stated differently, the first LED chips and the second LED chips may emit ultra violet light. Each of the first phosphor layer and the second phosphor layer may include a blue phosphor, a green phosphor, and a red phosphor. Moreover, the light-emitting apparatus may emit light providing a color other than white.

In addition, in the above exemplary embodiments, the LED chips mounted on the substrate are connected to one another through Chip To Chip connection via bonding wires. However, the LED chips may be connected to a wiring (metal film) disposed on a substrate using a bonding wire, and may be electrically connected to one another via the wiring.

Moreover, in the above exemplary embodiments, an LED chip is illustrated as a light-emitting element included in the light-emitting apparatus. However, a semiconductor light-emitting element such as a semiconductor laser or the like, or any other type of solid state light-emitting device such as an electro luminescence (EL) element, e.g., an organic EL element and an inorganic EL element, may be used for such light-emitting element.

Additionally, the light-emitting apparatus may include two or more types of light-emitting elements having different emission colors. For example, in addition to the LED chips which emit blue light, the light-emitting apparatus may include LED chips which emit red light, with the aim to enhance color rendering or the like.

Furthermore, the stack structure shown in the sectional views in the above exemplary embodiments is merely an example, and the present disclosure is not limited to the stack structure as described above. In other words, any stack structure which can achieve the functions that are characteristics of the present disclosure, as achieved by the above-mentioned stack structure, is also included within the scope of the present disclosure. For example, another layer may be disposed between the layers of the stack structure described above to an extent that the same or similar functions as achieved by the stack structure described above can be realized.

And furthermore, although the primary material included in each layer of the stack structure is illustrated in the above exemplary embodiments, each layer of the stack structure may also comprise other materials to an extent that the same or similar functions as achieved by the stack structure described above can be realized.

In other instances, various modifications to the exemplary embodiments according to the present disclosure described above that may be conceived by those skilled in the art and embodiments implemented by any combination of the components and functions shown in the exemplary embodiments are also included within the scope of the present disclosure, without departing from the spirit of the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light-emitting apparatus, comprising:
    a substrate;
    a first light-emitting element and a second light-emitting element disposed on the substrate;
    a sealing layer disposed above the first light-emitting element and the second light-emitting element for sealing the first light-emitting element and the second light-emitting element;
    a first phosphor layer disposed above a first portion of the sealing layer, the first phosphor layer including at least one first phosphor; and
    a second phosphor layer disposed above a second portion of the sealing layer, the second phosphor layer including at least one second phosphor,
    wherein the first phosphor layer is configured to emit light, which is emitted as a result of emission by the first light-emitting element, having a first color, and
    the second phosphor layer is configured to emit light, which is emitted as a result of emission by the second light-emitting element, having a second color different from the first color.

2. The light-emitting apparatus according to claim 1, further comprising:
    a dam disposed on the substrate so as to enclose the first light-emitting element and the second light-emitting element,
    wherein the sealing layer, the first phosphor layer, and the second phosphor layer are disposed in a region enclosed by the dam.

3. The light-emitting apparatus according to claim 1, further comprising:
    a dam disposed above the sealing layer and between the first phosphor layer and the second phosphor layer.

4. The light-emitting apparatus according to claim 1,
    wherein a content of the at least one first phosphor is different from a content of the at least one second phosphor.

5. The light-emitting apparatus according to claim 1,
    wherein each of the first light-emitting element and the second light-emitting element emits blue light, and
    each of the at least one first phosphor and the at least one second phosphor includes a yellow phosphor and a red phosphor.

6. The light-emitting apparatus according to claim 1, further comprising:
    a wire connected to one of the first light-emitting element and the second light-emitting element for feeding power,
    wherein the sealing layer further seals the wire.

7. The light-emitting apparatus according to claim 1,
    the at least one first phosphor includes a first yellow phosphor and a first red phosphor, and
    the at least one second phosphor includes a second yellow phosphor and a second red phosphor.

8. The light-emitting apparatus according to claim 7,
    wherein the first yellow phosphor is same as the second yellow phosphor, and
    the first red phosphor is same as the second red phosphor.

9. The light-emitting apparatus according to claim 7,
    wherein an amount of the first red phosphor included in the first phosphor layer is different than an amount of the second red phosphor included in the second phosphor layer.

10. The light-emitting apparatus according to claim 9,
    wherein the first phosphor layer is configured to emit the light at a temperature of 2700 K, and
    the second phosphor layer is configured to emit the light at a temperature of 8000 K.

11. The light-emitting apparatus according to claim 9,
    wherein the first phosphor layer and the second phosphor layer are configured to emit lights having a color temperature difference of at least 1000 K.

12. The light-emitting apparatus according to claim 1,
    wherein at least one of the first phosphor layer and the second phosphor layer includes a filler.

13. The light-emitting apparatus according to claim 1,
    wherein the sealing layer includes a filler.

14. The light-emitting apparatus according to claim 1,
    wherein the sealing layer includes a phosphor.

15. The light-emitting apparatus according to claim 1,
    wherein a base material of at least one of the first phosphor layer and the second phosphor layer is same as a material which forms the sealing layer.

16. The light-emitting apparatus according to claim 1,
    wherein the first phosphor layer and the second phosphor layer are in contact.

17. The light-emitting apparatus according to claim 1,
    wherein the first phosphor layer and the second phosphor layer are each disposed on a top surface of the sealing layer, the first phosphor layer and the second phosphor layer being disposed in parallel in a direction along the top surface.

18. The light-emitting apparatus according to claim 1, wherein the at least one first phosphor is homogenously diffused and disposed in the first phosphor layer, and the at least one second phosphor is homogenously diffused and disposed in the second phosphor layer.

19. An illumination apparatus, comprising:

the light-emitting apparatus according to claim 1; and a lighting apparatus for supplying the light-emitting apparatus with power for lighting the light-emitting apparatus.

20. A method for manufacturing a light-emitting apparatus, the method comprising:

mounting a first light-emitting element and a second light-emitting element on a substrate;

forming a sealing layer above the first light-emitting element and the second light-emitting element for sealing the first light-emitting element and the second light-emitting element;

applying a first phosphor layer above a first portion of the sealing layer, the first phosphor layer including at least one first phosphor; and applying a second phosphor layer above a second portion of the sealing layer, the second phosphor layer including at least one second phosphor;

wherein the first phosphor layer is configured to emit light, which is emitted as a result of emission by the first light-emitting element, having a first color, and the second phosphor layer is configured to emit light, which is emitted as a result of emission by the second light-emitting element, having a second color different from the first color.

\* \* \* \* \*